(12) United States Patent
Knese et al.

(10) Patent No.: US 8,558,327 B2
(45) Date of Patent: Oct. 15, 2013

(54) MICROMECHANICAL COMPONENT AND CORRESPONDING PRODUCTION METHOD

(75) Inventors: Kathrin Knese, Reutlingen (DE); Heribert Weber, Nuertingen (DE); Simon Armbruster, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 860 days.

(21) Appl. No.: 12/451,033

(22) PCT Filed: Feb. 29, 2008

(86) PCT No.: PCT/EP2008/052467
§ 371 (c)(1),
(2), (4) Date: Mar. 17, 2010

(87) PCT Pub. No.: WO2008/131981
PCT Pub. Date: Nov. 6, 2008

(65) Prior Publication Data
US 2010/0164023 A1 Jul. 1, 2010

(30) Foreign Application Priority Data
Apr. 26, 2007 (DE) .......................... 10 2007 019 639

(51) Int. Cl.
*H01L 29/84* (2006.01)
(52) U.S. Cl.
USPC ............ 257/415; 257/414; 257/E29.324; 438/53
(58) Field of Classification Search
CPC .................................... B81B 3/0086
USPC ............ 257/414–415, 417, 419, E29.324, 257/E21.214; 438/53
See application file for complete search history.

(56) References Cited

U.S. PATENT DOCUMENTS

| 6,012,335 A * | 1/2000 | Bashir et al. .................. 73/724 |
| 2007/0181962 A1 * | 8/2007 | Partridge et al. .............. 257/414 |

FOREIGN PATENT DOCUMENTS

| DE | 10 2004 036 032 | 7/2005 |
| EP | 1 215 476 | 6/2002 |
| EP | 1 671 923 | 6/2006 |

OTHER PUBLICATIONS

He et al.: "A silicon directly bonded capacitive absolute pressure sensor" Sensors and Actuators A. Elsevier Sequotia S.A. Lausanne, CH. Bd. 135, Nr. 2, Apr. 4, 2007, pp. 507-514, XP022016213.

* cited by examiner

*Primary Examiner* — Kenneth Parker
*Assistant Examiner* — Jose R Diaz
(74) *Attorney, Agent, or Firm* — Kenyon & Kenyon LLP (57) ABSTRACT

A micromechanical component having a conductive substrate, a first conductive layer provided above the substrate and that forms, above a cavity provided in the substrate, an elastically deflectable diaphragm region of monocrystalline silicon and an adjacent peripheral region, a circuit trace level provided above the first conductive layer in a manner that is electrically insulated from the first conductive layer, the circuit trace level having above the diaphragm region a first electrode region and having above the peripheral region a first connection region electrically connected to the same, and a second conductive layer that is provided above the circuit trace level, the second conductive layer having above the diaphragm region a second electrode region that is electrically insulated from the first electrode region, and having above the peripheral region a second connection region electrically insulated from the second electrode region and electrically connected to the first connection region. Also provided is a suitable production method.

9 Claims, 6 Drawing Sheets

MICROMECHANICAL COMPONENT AND CORRESPONDING PRODUCTION METHOD

FIELD OF THE INVENTION

The present invention relates to a micromechanical component. The present invention also relates to a corresponding production method.

BACKGROUND INFORMATION

Although applicable, in principle, to a multitude of micromechanical components, the exemplary embodiments and/or exemplary methods of the present invention, as well as the problem forming the basis of it, are explained with the aid of capacitive pressure sensors.

The starting point for explaining the problem providing the basis of the exemplary embodiments and/or exemplary methods of the present invention is a capacitive pressure sensor in which the capacitance of a first electrode, which may be elastically deflected by applying pressure, and the capacitance of a rigid second electrode, which is set apart and electrically insulated from the first electrode, are evaluated as an electrode pair.

Capacitive surface-micromechanics pressure sensors that are structured such that sacrificial layers underneath a diaphragm are removed through holes in the diaphragm or through lateral accesses under the diaphragm, the diaphragm forming the first elastically deflectable electrode, are generally known. Afterwards, the holes must be closed again, and additionally they have a negative effect on the stability and imperviousness of the diaphragm. Furthermore, it is known that a silicon diaphragm is used, it is made up of polycrystalline silicon. This is expedient in as much as the diaphragm electrode may only be made up of polysilicon or of a polycrystalline epitaxy-silicon layer that uses polysilicon as a starting layer due to the electric insulation of the two electrodes. However, in comparison with monocrystalline silicon, polycrystalline silicon has significantly worse electric and mechanical properties.

German patent documents DE 10 2004 036 032 A1, DE 10 2004 036 035 A1 and DE 100 32 579 A1 discuss a method for producing a micromechanical component, in particular, a diaphragm sensor, a self-supporting monocrystalline n-doped silicon lattice being provided on a p-doped semiconductor substrate, under which lattice a cavity is formed by selective dissolution or by rearranging porosified substrate material in high-temperature steps. A diaphragm of monocrystalline silicon, which is formed with the aid of an epitaxy method, is situated above the monocrystalline n-doped silicon lattice.

Figure 6:
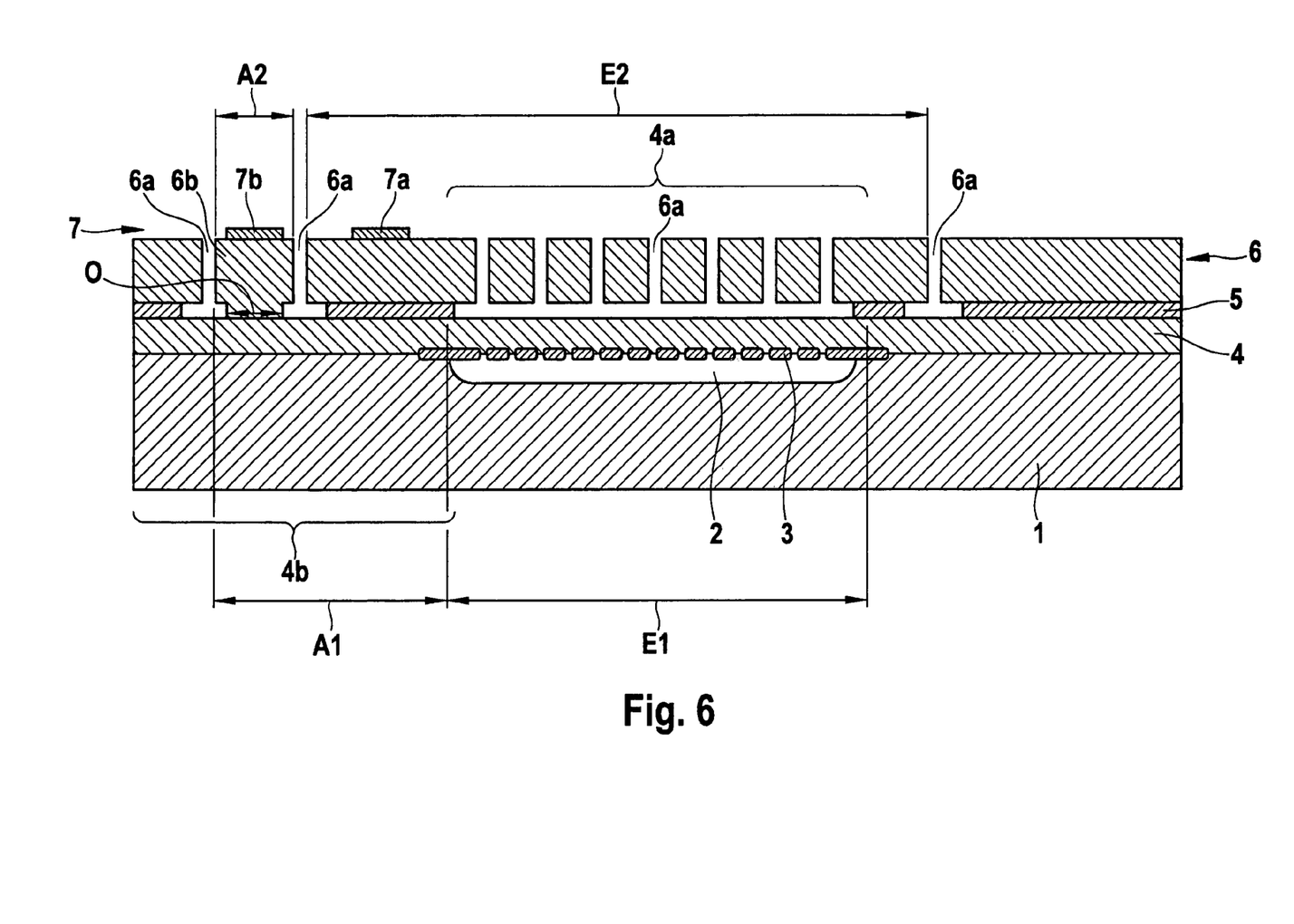
FIG. 6 shows a schematic sectional view of a capacitive pressure sensor to explain the structure of a micromechanical component in the form of a capacitive pressure sensor to explain the problem providing the basis of the present invention.

FIG. 6 shows a schematic sectional view of a capacitive pressure sensor to explain the structure of a micromechanical component in the form of a capacitive pressure sensor to explain the problem providing the basis of the exemplary embodiments and/or exemplary methods of the present invention.

In FIG. 6, reference numeral 1 labels a p-doped silicon semiconductor substrate, above which is formed a self-supporting monocrystalline n-doped silicon lattice 3 along with a cavity 2 situated below it, in accordance with the teaching of DE 10 2004 036 032 A1 and DE 10 2004 036 035 A1. A monocrystalline, epitaxially deposited silicon layer 4 having a diaphragm region 4a, which acts as first elastically deflectable electrode region E1 of the micromechanical capacitive pressure sensor, is situated above n-doped silicon lattice 3. A peripheral region 4b of monocrystalline, epitaxially deposited silicon layer 4, which acts as first connection region A1 of the micromechanical capacitive pressure sensor, is provided to the side.

An insulating sacrificial layer 5, which is made up of silicon oxide, for example, is deposited and patterned on the monocrystalline silicon layer 4 using known methods. Monocrystalline silicon layer 4, in particular, its peripheral region 4b and thus also silicon substrate 1 situated under it, may be electrically contacted via one or more openings O formed in sacrificial layer 5. This occurs in that after one or multiple openings O is/are formed, a polycrystalline epitaxial silicon layer 6 is deposited on sacrificial layer 5. In the region of openings O, epitaxial silicon layer 6 may be implemented both as polycrystalline and monocrystalline, depending on the starting layer used.

Polycrystalline silicon layer 6 is now patterned using a photolithographic technology, followed by a trench-etching step for forming traversing trenches 6a, such that an electric separation of second electrode region E2 and of second connection region A2 may be achieved. One or more self-supporting elements 6b of polycrystalline epitaxial silicon layer 6, which form second connection region A2, are thus electrically connected to first connection region A1 of monocrystalline silicon layer 4 and are used to contact it from outside. Furthermore, trenches 6a are used to generate a perforation in second electrode region E2, through which sacrificial layer 5 between first monocrystalline silicon layer 4 and second polycrystalline silicon layer 6 may be removed using sacrificial-layer etching (e.g., gas-phase etching). In this manner, a monocrystalline first electrode region E1 is obtained whose deflection with regard to second electrode region E2 may be evaluated capacitively.

Afterward, the depositing and patterning of a metallization level 7 takes place, on which contacting surfaces 7a, 7b are formed, via which second electrode region E2 and second connection region A2, respectively, may be connected to corresponding connections of a housing (not shown) by wire bonding. However, the relatively high stray capacitances of substrate 1 and of monocrystalline silicon layer 4 with regard to the (not shown) housing are a disadvantage of such a structure.

SUMMARY OF THE INVENTION

The micromechanical component of the present invention having the features described herein and the manufacturing method as described herein have the advantage that they provide a simple and reliable process for manufacturing micromechanical components, in particular capacitive pressure sensors, which may be implemented in a cost-effective manner. In particular, the exemplary embodiments and/or exemplary methods of the present invention allows for a capacitive pressure sensor that is less affected by stray capacitances. It is additionally advantageous that the mechanically active element (diaphragm) is made of monocrystalline Si (break/tear stability, known material values, . . . ), and that it seals the cavity for the long term and reliably (in contrast to Poly-Si, LPCVD-SiN, . . . ).

An aspect of the exemplary embodiments and/or exemplary methods of the present invention is to refrain from contacting the diaphragm layer and thus at the same time the substrate situated below it as a whole, and instead, in order to reduce stray capacitances, to produce an additional circuit trace level and wiring level on the diaphragm level in an electrically insulated manner. The electric contacting of the additional wiring level and circuit trace level, respectively, also takes place expediently via an insulated region in the layer, produced by trenching, for example, which also forms the upper second rigid electrode. If the level of the second rigid electrode is produced by epitaxy, it is advantageous to make the additional wiring level and circuit trace level out of polysilicon (optionally doped, as well), since relatively high temperatures arise during epitaxy.

Advantageous refinements and improvements to the respective subject matter of the present invention are set forth herein.

According to one exemplary refinement, a circuit arrangement is integrated in the first conductive layer (epitaxially grown monocrystalline silicon layer), and the first connection region and the second electrode region are electrically connected to the circuit arrangement. According to an additional refinement, the second conductive layer (second epitaxially grown silicon layer) has both regions grown in a polycrystalline manner and regions grown in a monocrystalline manner, a circuit arrangement being integrated into the monocrystalline regions.

According to another exemplary refinement, the substrate has on its side opposite the diaphragm region (substrate backside) perforation openings that make the cavity accessible from behind. In this manner, a relative pressure sensor may be implemented out of an absolute pressure sensor.

According to another exemplary refinement, the second electrode region and/or the second connection region have through-hole regions that are routed through the substrate to the side of the substrate opposite the diaphragm region in an electrically insulated manner, and are connected to electric contact surfaces.

Exemplary embodiments of the present invention are shown in the drawing and are explained in more detail in the following description.

DETAILED DESCRIPTION

In the figures, like reference numerals designate like or functionally equivalent components.

Figure 1:
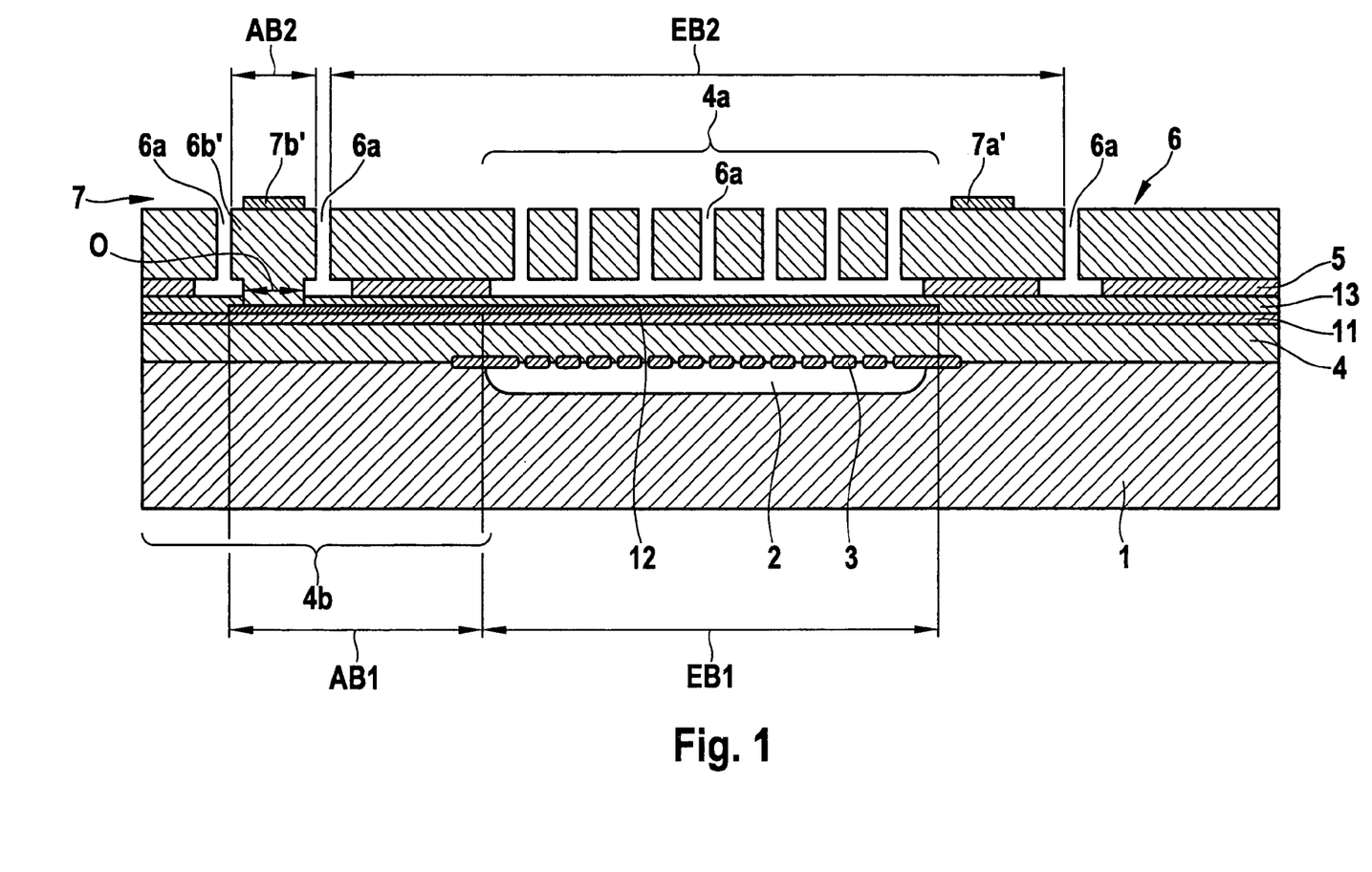
FIG. 1 shows a schematic sectional view of a capacitive pressure sensor to explain the structure of a micromechanical component in the form of a capacitive pressure sensor according to a first specific embodiment of the present invention.

FIG. 1 shows a schematic sectional view of a capacitive pressure sensor to explain the structure of a micromechanical component in the form of a capacitive pressure sensor according to a first specific embodiment of the present invention.

In FIG. 1, reference numeral 1 labels a conductive silicon substrate having a first conductive layer 4 of monocrystalline silicon, which is provided above substrate 1 and which forms, above a cavity 2 provided in substrate 1, an elastically deflectable diaphragm region 4a and an adjacent peripheral region 4b. As a result of the production process (see above regarding FIG. 6), a monocrystalline silicon lattice 3 is provided above cavity 2 between substrate 1 and first conductive layer 4, which also allows for a conductive layer 4 growing in a monocrystalline manner in diaphragm region 4a. A first insulation layer 11 of silicon oxide is provided on this first conductive layer 4 of monocrystalline silicon, on which in turn a circuit trace level 12 of polycrystalline silicon is provided in a manner electrically insulated from first conductive layer 4, circuit trace level 12 having above diaphragm region 4a a large-area first electrode region EB1 and above peripheral region 4b a strip-like first connection region AB1 electrically connected to the same.

A second insulation layer 13 of silicon nitride is provided on circuit trace level 12, above which a sacrificial layer 5 of silicon oxide is situated. In this connection, layers 13 and 5 may be respectively patterned individually, but also together. Above sacrificial layer 5, a second conductive layer 6 of polycrystalline silicon is provided, which has above diaphragm region 4a a second electrode region EB2, which is electrically insulated from first electrode region EB1, and second conductive layer 6 has above peripheral region 4b a second connection region AB2, which is electrically insulated from second electrode region EB2 and is electrically connected to first connection region AB1 via a corresponding opening O of second insulation layer 13 and of sacrificial layer 5.

To produce the first specific embodiment shown in FIG. 1, first insulation layer 11 of silicon oxide is deposited on monocrystalline silicon layer 4 following the depositing of monocrystalline silicon layer 4 (until then, see above regarding FIG. 6).

Afterward, circuit trace level 12 of polycrystalline silicon is deposited and patterned on first insulation layer 11. In particular, circuit trace level 12 in diaphragm region 4a acts as first electrode region EB1 and is to be designed there to cover a large surface. A supply region, which may have a narrower diameter, is to be formed outside of diaphragm region 4a. After the patterning of circuit trace level 12, second insulation layer 13 of silicon nitride is deposited over the entire structure, over its entire surface. Subsequently, sacrificial layer 5 of silicon oxide is deposited over second insulation layer 13 of silicon nitride.

Afterward, an opening O is formed in second insulation layer 13 and in sacrificial layer 5 for the electric connection of first connection region AB1 of circuit trace level 12. Then, polycrystalline silicon layer 6 is grown epitaxially on sacrificial layer 5 or in opening O. Afterward, the depositing and patterning of a metallization level 7 takes place, with which contacting surfaces 7a', 7b' are formed, via which second electrode region EB2 and second connection region AB2, respectively, may be connected to corresponding connections of a housing (not shown) by wire bonding.

Polycrystalline silicon layer 6 is now patterned using a photolithographic technology, followed by a trench-etching step for forming traversing trenches 6a, such that an electric separation of second electrode region EB2 and second connection region AB2 may be achieved. One or more self-supporting elements 6b' of polycrystalline epitaxial silicon layer 6, which form second connection region AB2, is/are thus electrically connected to first connection region AB1 of polycrystalline circuit trace layer 12 through opening O and thus are used to contact it from outside. Furthermore, trenches 6a are used to produce a lattice-like perforation in second electrode region EB2, through which sacrificial layer 5 between insulation layer 13 and second polycrystalline silicon layer 6 may be removed using gas-phase etching. In this manner, a first electrode region EB1 having a monocrystalline diaphragm whose deflection with regard to second electrode region EB2 may be evaluated capacitively is obtained.

As may be seen from FIG. 1, circuit trace level 12 is contacted by self-supporting region 6b' of polycrystalline polysilicon layer 6 in connection region AB2, and is in turn electrically insulated in the downward and upward direction and laterally by first and second insulation layer 11, 13. Thus, in this specific embodiment, a direct electric contacting of monocrystalline silicon layer 4 and thus of substrate 1 may be avoided, which contributes to the elimination of the effects of stray capacitances.

Figure 2:
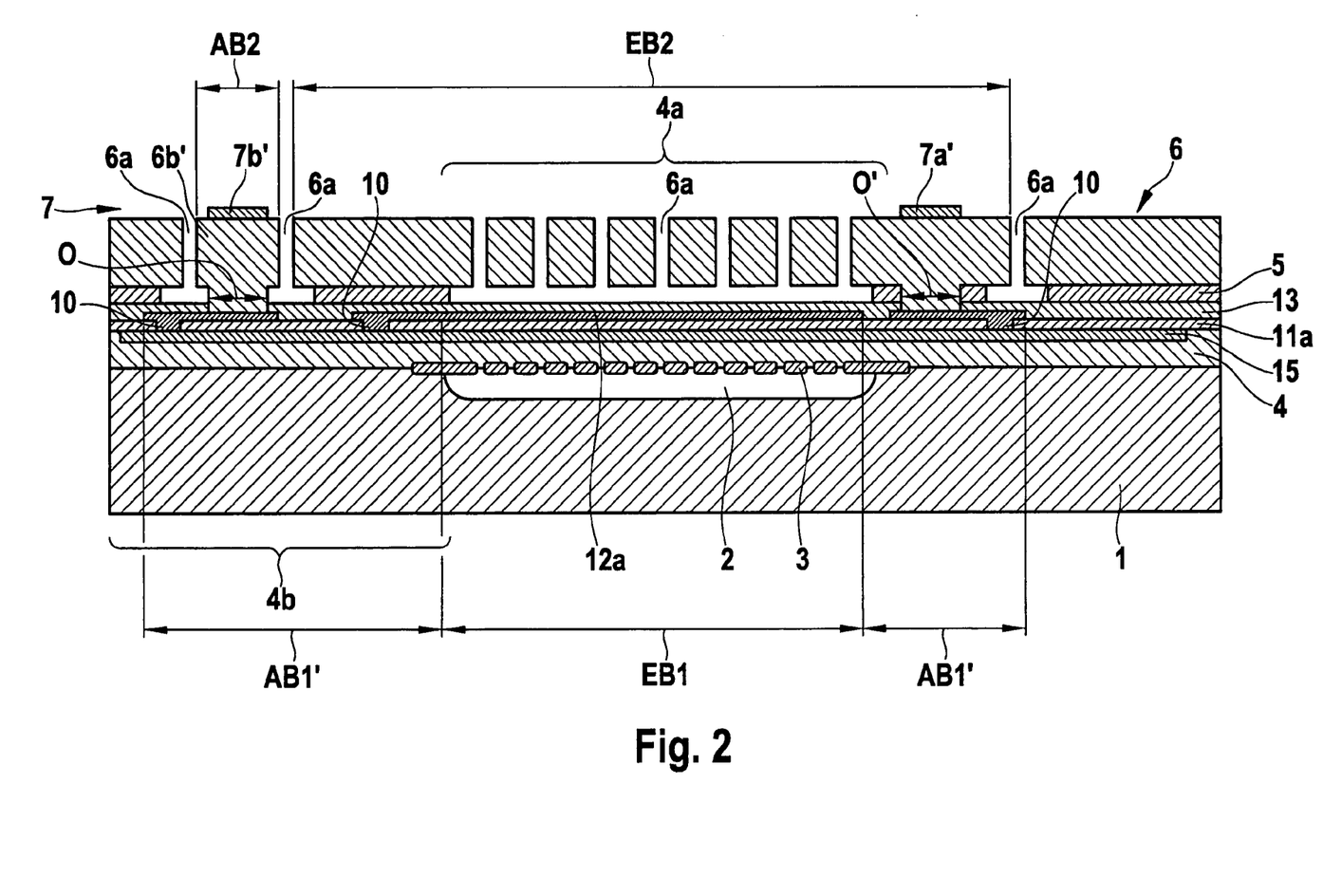
FIG. 2 shows a schematic sectional view of a capacitive pressure sensor to explain the structure of a micromechanical component in the form of a capacitive pressure sensor according to a second specific embodiment of the present invention.

FIG. 2 shows a schematic sectional view of a capacitive pressure sensor to explain the structure of a micromechanical component in the form of a capacitive pressure sensor according to a second specific embodiment of the present invention.

In the second specific embodiment, a circuit arrangement 15 is integrated in first conductive layer 4, and first connection region AB1' is electrically connected to circuit arrangement 15 via feed-throughs 10. Furthermore, second electrode region EB2 is also electrically connected to circuit arrangement 15 via an opening O' in second insulation layer 13 and in sacrificial layer 5 and via first connection region AB1'. This second specific embodiment has the advantage that the entire evaluation of the signals of the two electrode regions EB1, EB2 may occur in circuit arrangement 15, and in second connection region AB2 the electrically conditioned sensor signal is already able to be tapped from outside.

To produce the second specific embodiment shown in FIG. 2, integrated electric circuit arrangement 15 is produced in monocrystalline silicon layer 4 after monocrystalline silicon layer 4 is deposited. In particular, integrated electric circuit arrangement 15 is connected to circuit trace level 12a situated above first insulation layer 11a via feed-throughs 10, which are formed by forming corresponding through holes and by depositing and patterning wiring layer 12a.

Subsequently, after patterning circuit trace level 12a, which is made up of polysilicon in the present example, as well, second insulation layer 13 is deposited over the entire structure, after which the subsequent process steps ensue as in the first specific embodiment explained above. The only difference in the second specific embodiment is that polycrystalline silicon layer 6 contacts circuit trace level 12a through opening O' and no contact surface is provided on electrode region EB2, since the capacitance signal is evaluated directly on the sensor element due to the integrated circuit arrangement.

Figure 3:
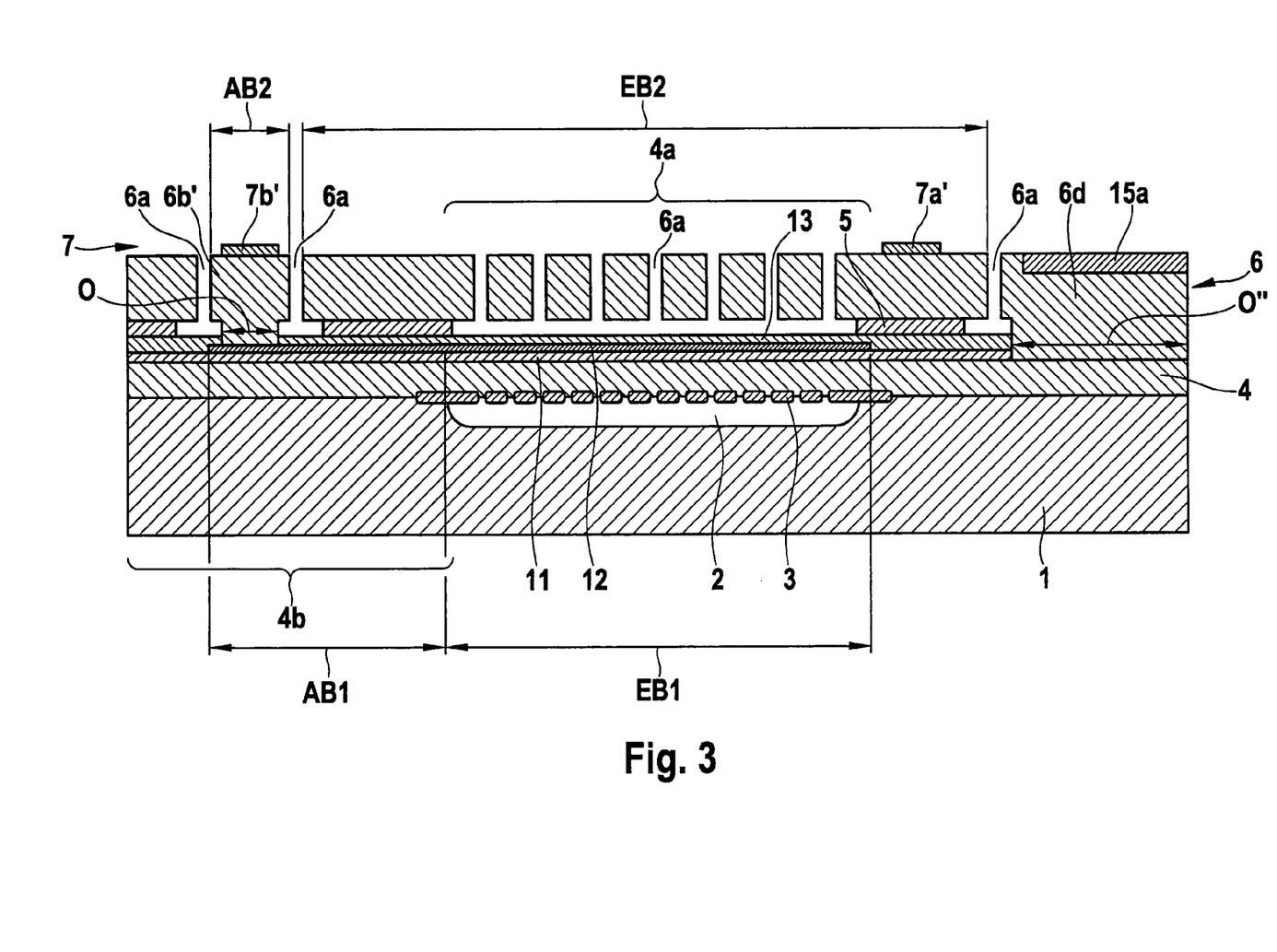
FIG. 3 shows a schematic sectional view of a capacitive pressure sensor to explain the structure of a micromechanical component in the form of a capacitive pressure sensor according to a third specific embodiment of the present invention.

FIG. 3 shows a schematic sectional view of a capacitive pressure sensor to explain the structure of a micromechanical component in the form of a capacitive pressure sensor according to a third specific embodiment of the present invention.

In the third specific embodiment, the structure corresponds to that according to the first specific embodiment according to FIG. 1 except for the fact that an integrated electric circuit arrangement 15a is provided in second silicon layer 6. In this context, efforts are to be made to ensure that second silicon layer 6 may grow in an epitaxial, monocrystalline manner in a corresponding region on monocrystalline silicon layer 4 and that substrate 1 may grow in a monocrystalline manner, in order to implement integrated circuit 15a. This may be achieved by forming a corresponding opening O' in first insulation layer 11, second insulation layer 13, and sacrificial layer 5 (possibly also in monocrystalline silicon layer 4).

Both in the second and in the third specific embodiment, the individual parts of integrated circuit arrangement 15 and 15a may also be implemented in a multilayered manner. In the third specific embodiment, the individual circuit parts of integrated circuit arrangement 15a may also be connected by additional metal circuit traces, which in turn may also be executed in a multilayered manner. Furthermore, in the third specific embodiment, insulation trenches 6a in the level of polycrystalline silicon layer 6 could be filled using an insulator material, which significantly simplifies the connection to integrated circuit 15a.

Figure 4:
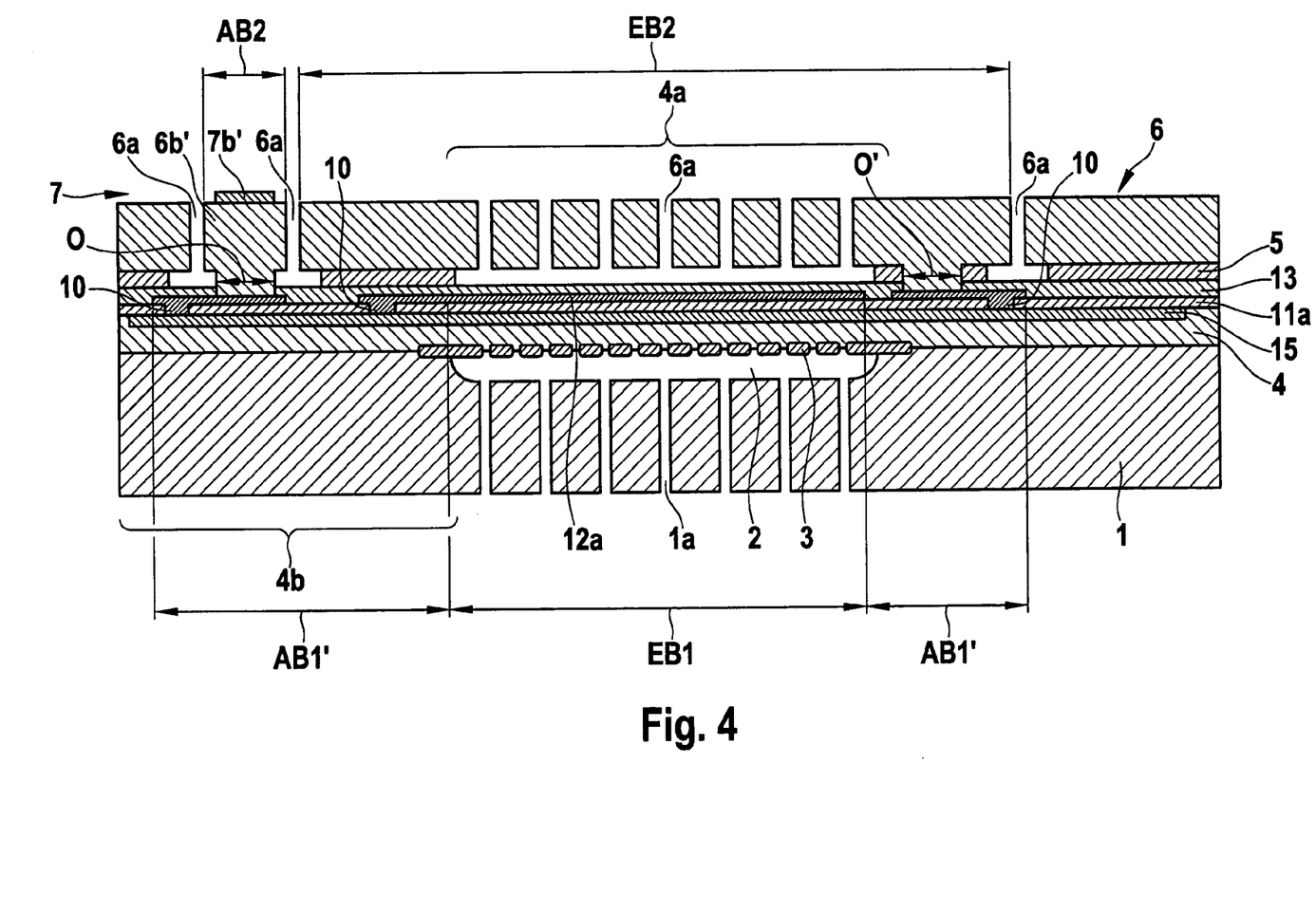
FIG. 4 shows a schematic sectional view of a capacitive pressure sensor to explain the structure of a micromechanical component in the form of a capacitive pressure sensor according to a fourth specific embodiment of the present invention.

FIG. 4 shows a schematic sectional view of a capacitive pressure sensor to explain the structure of a micromechanical component in the form of a capacitive pressure sensor according to a fourth specific embodiment of the present invention.

In the fourth specific embodiment, the only difference to the second specific embodiment shown in FIG. 2 is that perforation holes 1a on the back side are provided, which make cavity 2 accessible from the back side of the sensor, allowing for the production of a relative pressure sensor. Expediently, the processing of the back side of substrate 1 to produce perforation holes 1a takes place after completion of the processing of the front side of substrate 1.

Figure 5:
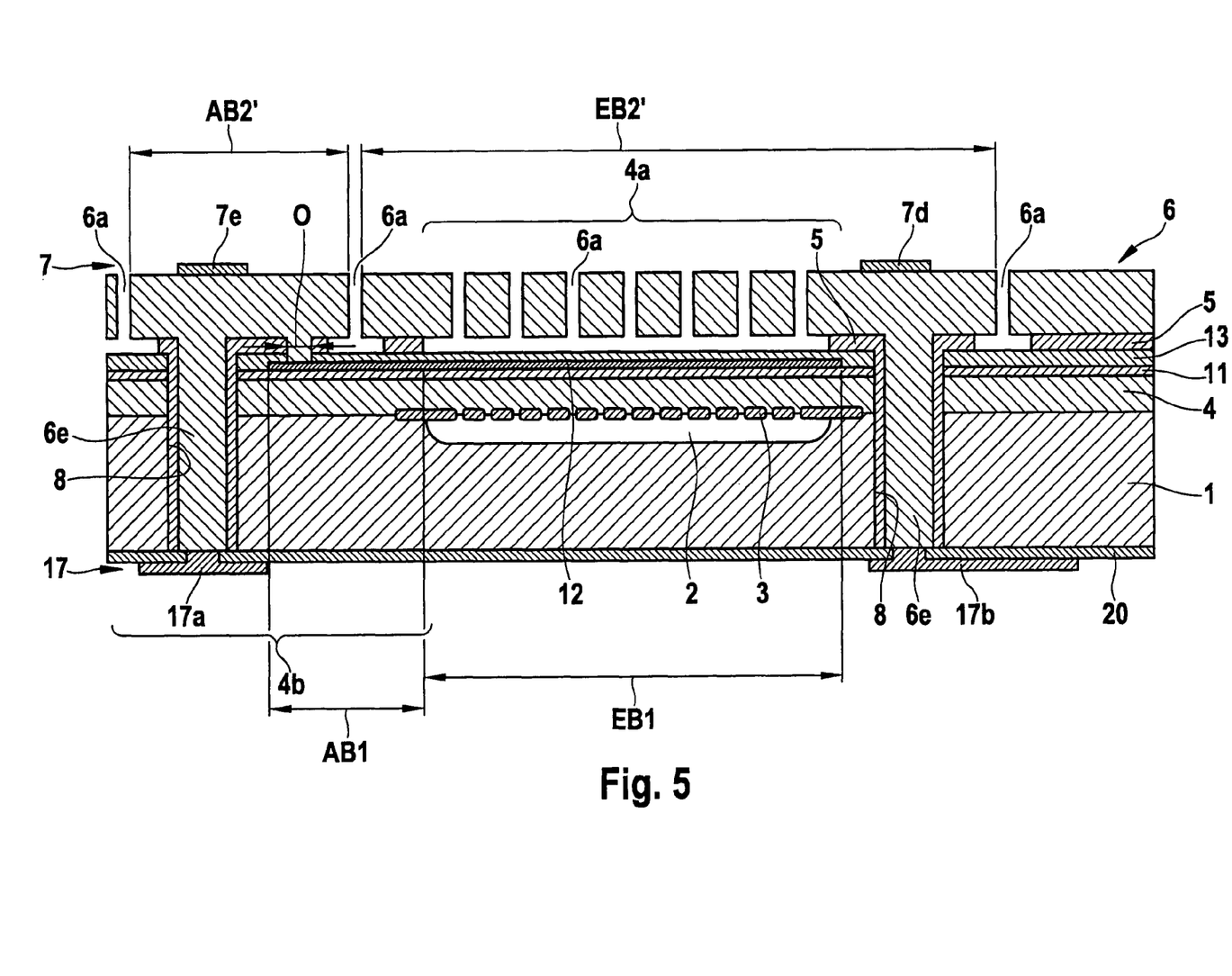
FIG. 5 shows a schematic sectional view of a capacitive pressure sensor to explain the structure of a micromechanical component in the form of a capacitive pressure sensor according to a fifth specific embodiment of the present invention.

FIG. 5 shows a schematic sectional view of a capacitive pressure sensor to explain the structure of a micromechanical component in the form of a capacitive pressure sensor according to a fifth specific embodiment of the present invention.

While the above-described first through fourth specific embodiments provide the electric contacting of the respective pressure sensor to the outside world by classic wire bonding on the front side, the fifth specific embodiment allows for a variant in which a wafer feed-through may be used. Thus, one has the option of building flip-chip stacks out of sensor and evaluation chips. This method of design has the advantage of allowing modifications to be performed in sensor or evaluation chips, without having to accept a reciprocal influence in the functionality.

In the fifth specific embodiment, after deposition of second insulation layer 13 from the upper side of substrate 1, trenches 8 are etched into substrate 1 at the locations of the desired feed-throughs. Afterward, a conformal deposition of sacrificial layer 5, which also covers the side walls and the floor of trenches 8 and thus forms an electric insulation of the feed-throughs with respect to substrate 1 and monocrystalline silicon layer 4, takes place.

Subsequently, as described above, the deposition and patterning of polycrystalline silicon layer 6 and of a front-side metal layer 7 for forming connection surfaces 7d and 7e for feed-throughs 6e in second electrode region EB2' and in second connection region AB2' takes place, and the sacrificial layer etching takes place. In this context, trenches 8 are filled with polycrystalline silicon layer 6 and thus form the subsequent feed-through regions.

Afterward, substrate 1 is smoothed from the back side, until feed-throughs 6e are exposed from polycrystalline silicon layer 6, that is, sacrificial layer 5 is removed from the trench floors. Subsequently, the deposition and patterning of a back-side insulation layer 20 and a back-side metal layer 17 is carried out to form back-side connection surfaces 17a and 17b for feed-throughs 6e in second connection region AB2' and in second electrode region EB2'.

Although the exemplary embodiments and/or exemplary methods of the present invention has been described above with reference to exemplary embodiments, it is not limited thereto but rather is modifiable in many ways.

In particular, individual process steps may be interchanged with one another in their order without deviating from the subject matter of the exemplary embodiments and/or exemplary methods of the present invention. Thus, for example, the processing of the back side of the wafer may take place before the processing of the front side of the wafer or may be completed by itself, or the processing of the front side of the wafer may take place first or be completed by itself, and the processing of the back surface of the wafer may take place afterward. However, individual process steps on the front side of the wafer and on the back side of the wafer may alternate with each other successively in the course of the entire process, as well, i.e., the front side of the wafer is processed once and then the back side of the wafer is processed once more, etc., each over the course of one or more steps. The abovementioned process flows are to be regarded as advantageous in many respects, but are not the only possible process sequences in the sense of the exemplary embodiments and/or exemplary methods of the present invention.

The insulation for both sides of the additional wiring level and circuit trace level is not restricted to two individual insulation layers, but rather may be made up of combinations of multiple different insulators, such as silicon oxide, silicon nitride, silicon carbine, etc.

Although the previously described exemplary embodiments all relate to capacitive pressure sensors, they are not restricted to them, but rather may be used for capacitive microphones, as well, for example. All previously described specific embodiments also may be combined with a piezoresistive evaluation variant. Thus, one obtains a capacitive or piezoresistive pressure sensor having a self-testing option.

All previously described specific embodiments may also be provided with an additional electric insulation between substrate 1 and monocrystalline silicon layer 4 to further reduce parasitic capacitances.

It is also possible to provide all silicon layers deposited in a monocrystalline and polycrystalline manner with any doping and any concentrations of doping material.

What is claimed is:

1. A micromechanical component, comprising:
   a conductive substrate;
   a first conductive layer that is provided above the substrate and forms, above a cavity provided in the substrate, an elastically deflectable diaphragm region of monocrystalline silicon and an adjacent peripheral region;
   a circuit trace level that is provided above the first conductive layer in a manner electrically insulated from the first conductive layer, the circuit trace level having above the diaphragm region a first electrode region, and having above the peripheral region, a connection region which is connected to the same in an electric manner; and
   a second conductive layer provided above the circuit trace level, the second conductive layer having above the diaphragm region a second electrode region that is electrically insulated from the first electrode region, and having above the peripheral region a second connection region that is electrically insulated from the second electrode region and that is electrically connected to the first connection region;
   wherein the first conductive layer is produced out of monocrystalline silicon and the second conductive layer is produced out of polycrystalline silicon;
   wherein a lattice structure of monocrystalline silicon is provided above the cavity between the substrate and the first conductive layer; and
   wherein at least one of the second electrode region and the second connection region have feed-through regions that are routed through the substrate to the side of the substrate opposite the diaphragm region in an electrically insulated manner, and are connected to electric contact surfaces.

2. The micromechanical component of claim 1, wherein a circuit arrangement is integrated in the first conductive layer, and the first connection region is electrically connected to the circuit arrangement.

3. The micromechanical component of claim 2, wherein the second electrode region is electrically connected to the circuit arrangement.

4. The micromechanical component of claim 1, wherein the second conductive layer has a region in which a circuit arrangement is integrated.

5. The micromechanical component of claim 4, wherein the first conductive layer is monocrystalline, and the region is grown in a monocrystalline manner on the first conductive layer.

6. The micromechanical component of claim 4, wherein the substrate is monocrystalline, and the region is grown in a monocrystalline manner on substrate.

7. The micromechanical component of claim 1, wherein the substrate has perforation openings on its side opposite the diaphragm region, which make the cavity accessible from the back side of the substrate.

8. The micromechanical component of claim 1, wherein the circuit trace level is produced out of polycrystalline silicon.

9. A method for producing a micromechanical component, the method comprising:
   providing a conductive substrate having a cavity;
   forming above the substrate a first conductive layer that forms, above a cavity, an elastically deflectable diaphragm region out of monocrystalline silicon and an adjacent peripheral region;
   forming a first insulation layer above the first conductive layer;
   forming a circuit trace level above the first insulation layer, the circuit trace level having a first electrode region above the diaphragm region, and above the peripheral region a connection region electrically connected to the same;
   forming a second insulation layer above the circuit trace level;
   forming a sacrificial layer level above insulation layer;
   forming a second conductive layer above the sacrificial layer level, the second conductive layer having above the diaphragm region a second electrode region that is electrically insulated from the first electrode region, and having above the peripheral region a second connection region that is electrically insulated from the second electrode region and that is electrically connected to the first connection region;
   wherein the first conductive layer is produced out of monocrystalline silicon and the second conductive layer is produced out of polycrystalline silicon;
   wherein a lattice structure of monocrystalline silicon is provided above the cavity between the substrate and the first conductive layer; and
   wherein at least one of the second electrode region and the second connection region have feed-through regions that are routed through the substrate to the side of the substrate opposite the diaphragm region in an electrically insulated manner, and are connected to electric contact surfaces.

* * * * *

UNITED STATES PATENT AND TRADEMARK OFFICE
CERTIFICATE OF CORRECTION

PATENT NO.       : 8,558,327 B2                                           Page 1 of 1
APPLICATION NO.  : 12/451033
DATED            : October 15, 2013
INVENTOR(S)      : Knese et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 954 days.

Signed and Sealed this

Fifteenth Day of September, 2015

Michelle K. Lee
*Director of the United States Patent and Trademark Office*